(12) United States Patent
Lojek

(10) Patent No.: US 7,301,794 B2
(45) Date of Patent: Nov. 27, 2007

(54) NON-VOLATILE MEMORY ARRAY WITH SIMULTANEOUS WRITE AND ERASE FEATURE

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/461,939

(22) Filed: Aug. 2, 2006

(65) Prior Publication Data

US 2006/0285384 A1 Dec. 21, 2006

Related U.S. Application Data

(62) Division of application No. 11/407,568, filed on Apr. 19, 2006, and a division of application No. 10/773,059, filed on Feb. 4, 2004, now Pat. No. 7,092,288.

(51) Int. Cl.
*G11C 5/06* (2006.01)
(52) U.S. Cl. .............. 365/63; 365/185.01; 365/189.04
(58) Field of Classification Search .......... 365/63, 365/185.05, 185.14, 185.15, 189.04, 185.01
See application file for complete search history.

(56) References Cited

U.S. PATENT DOCUMENTS

| | | | |
|---|---|---|---|
| 5,732,017 A | 3/1998 | Schumann et al. | |
| 5,889,711 A * | 3/1999 | Yang et al. | 365/200 |
| 5,949,716 A | 9/1999 | Wong et al. | |
| 5,959,887 A | 9/1999 | Takashina | |
| 6,032,248 A | 2/2000 | Curry et al. | |
| 6,212,105 B1 | 4/2001 | Kowalski | |
| 6,780,712 B2 * | 8/2004 | Hsieh | 438/257 |
| 7,099,226 B2 | 8/2006 | Yuan et al. | |
| 2006/0187707 A1 * | 8/2006 | Lojek | 365/185.01 |

* cited by examiner

*Primary Examiner*—Richard T. Elms
*Assistant Examiner*—Alexander Sofocleous
(74) *Attorney, Agent, or Firm*—Schneck & Schneck; Thomas Schneck

(57) ABSTRACT

A non-volatile transistor memory array has individual cells with a current injector and a non-volatile memory transistor. Injector current gives rise to charged particles that can be stored in the memory transistor by tunneling. When a row of the array is activated by a word line, the active row has current injectors ready to operate if program line voltages are appropriate to cause charge storage in a memory cell, while a cell in an adjacent row be erased by charge being driven from a memory transistor. A series of conductive plates are arranged over the word line, with each plate having a pair of oppositely extending tangs, one causing programming of a cell in a first row and another causing erasing of a cell in another row.

7 Claims, 7 Drawing Sheets

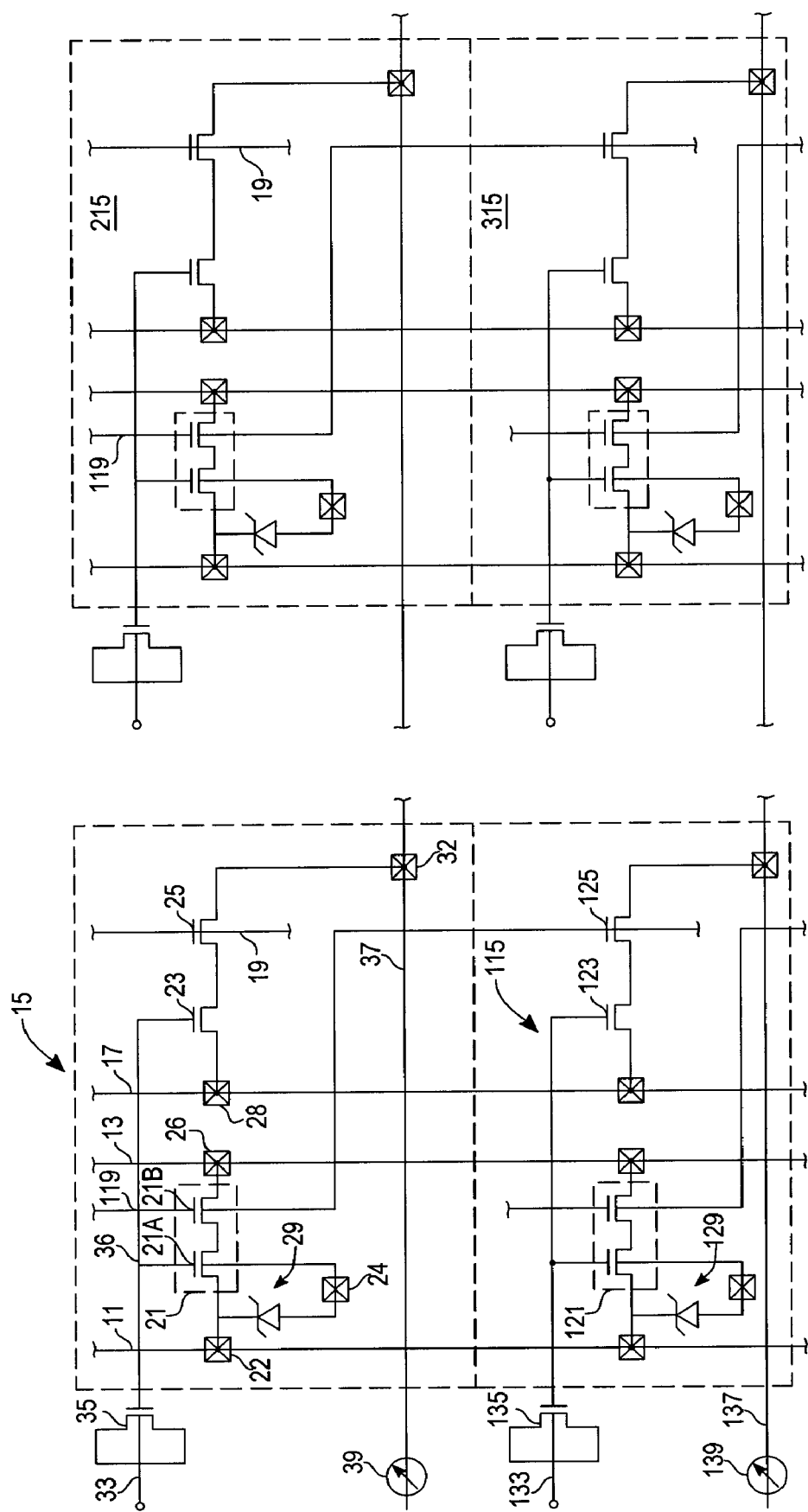
Fig._1

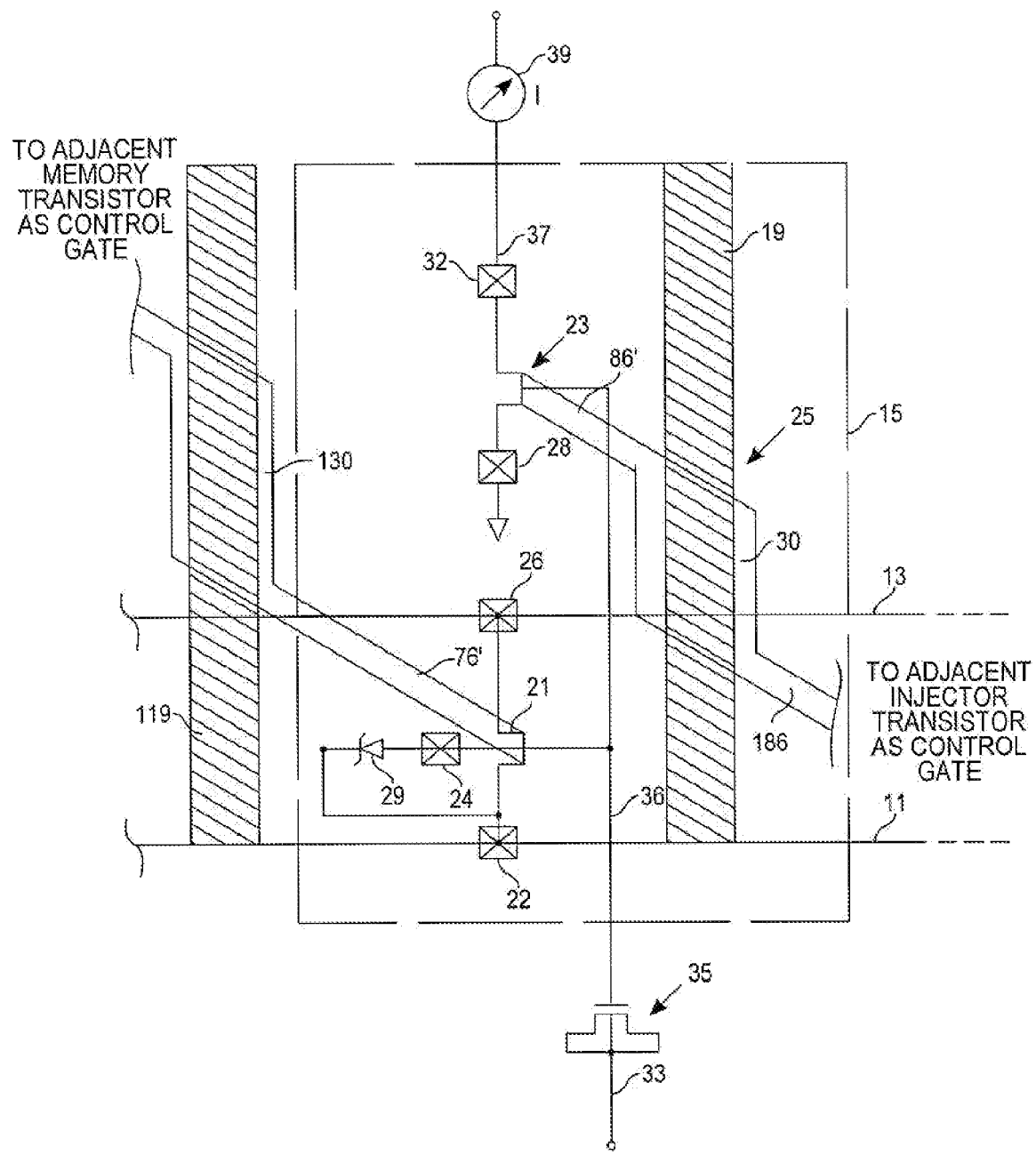
Fig._2

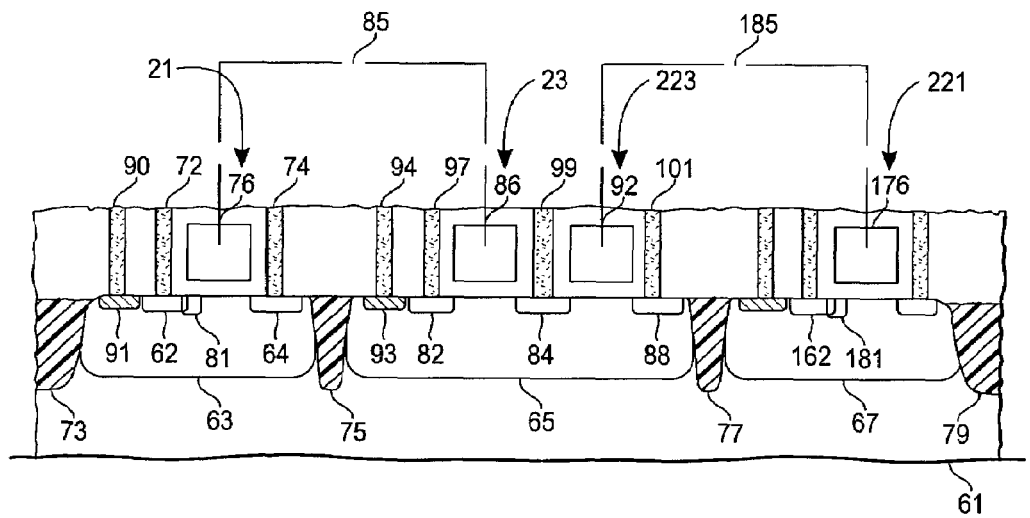
Fig._3
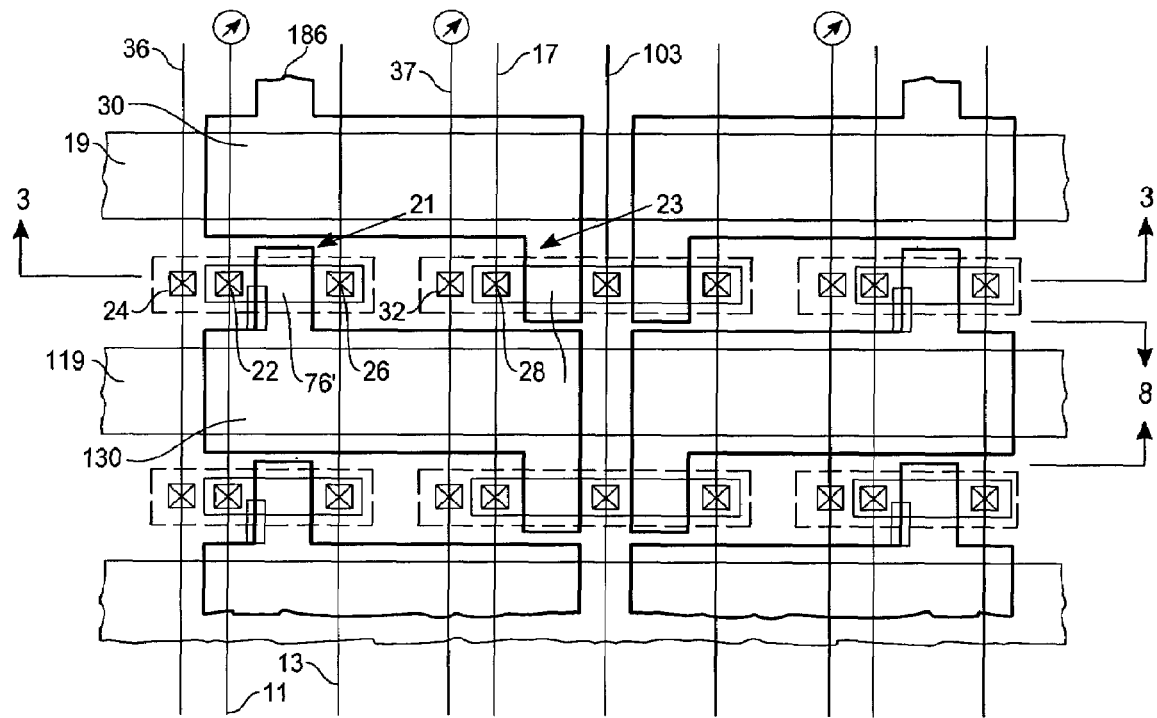
Fig._4

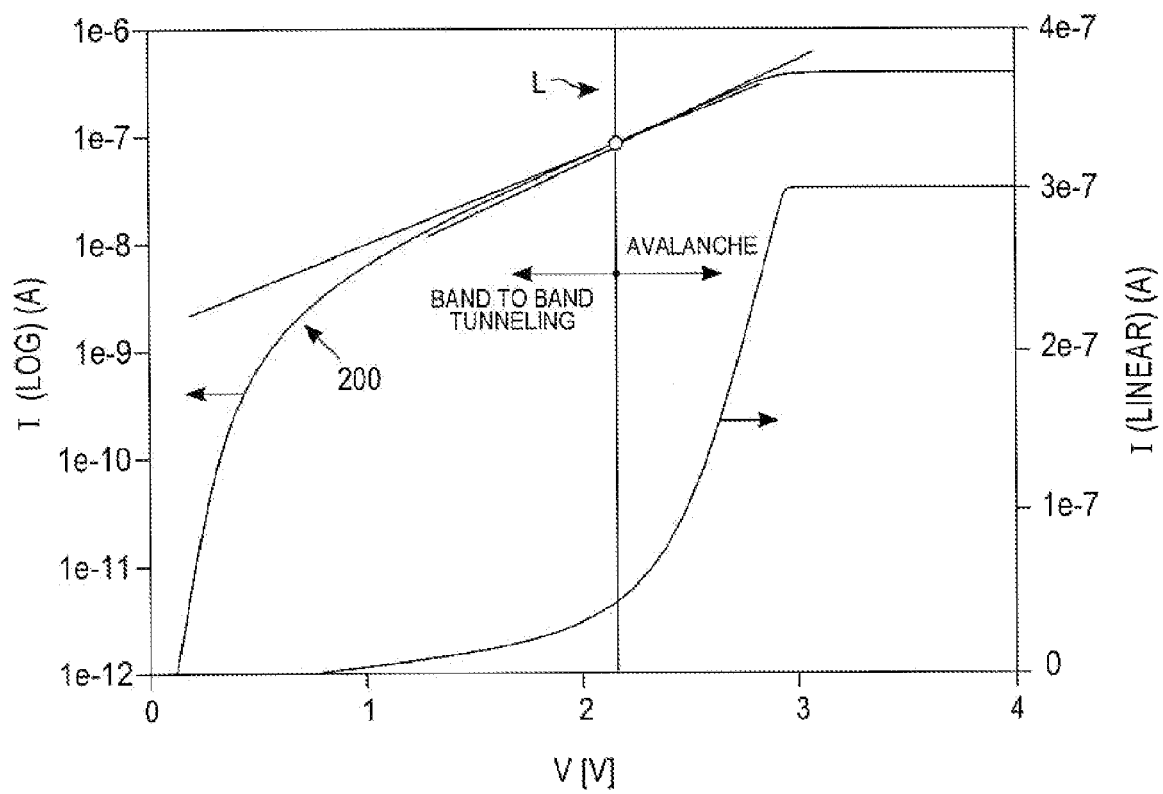
Fig._5

Fig. _ 7

NON-VOLATILE MEMORY ARRAY WITH SIMULTANEOUS WRITE AND ERASE FEATURE

CROSS-REFERENCE TO RELATED APPLICATION

This is a divisional of pending U.S. patent application Ser. No. 10/773,059 filed Feb. 4, 2004, now U.S. Pat. No. 7,092,288, issued Aug. 15, 2006 and a sister divisional of application Ser. No. 11/407,568, filed Apr. 19, 2006.

TECHNICAL FIELD

The invention relates to non-volatile memory arrays and, in particular, to a non-volatile memory array adapted for a simultaneous write and erase.

BACKGROUND ART

Impact ionization has been known for several years. U.S. Pat. No. 4,432,075 to B. Eitan and U.S. Pat. No. 4,821,236 to Hayashi et al. describe an EEPROM transistor adjacent to a charge generator, creating a substrate current near the EEPROM, creating excess charge or holes, resembling space charge, near subsurface electrodes of the EEPROM. Assume that the holes are generated and accelerated toward one of the electrodes of the EEPROM. Resulting secondary electrons are sufficiently energetic to penetrate gate oxide over the substrate and become injected into a conductive floating gate. For very small EEPROMs, the floating gate becomes charged by band-to-band tunneling, a situation which eliminates the need for a control gate over the floating gate.

U.S. Pat. No. 5,126,967 and U.S. Pat. No. 4,890,259 to R. Sinks describe a memory array made of non-volatile transistors that can store analog waveforms.

The ability of EEPROM transistors to directly record analog waveforms, without A-to-D conversion, gives rise to new applications, such as use in neural networks. This has been pointed out in U.S. Pat. No. 6,125,053 where C. Dioris and C. Mead describe use of EEPROMs storing variable amounts of charge generated by impact ionization to represent an analog value. This is in contrast to a conventional EEPROM where a floating gate either stores charge or does not store charge, thereby indicating a digital value. In the '053 patent, an EEPROM is described that permits simultaneous writing and reading.

An analogous problem is simultaneous programming and erasing operations in an array. An object of the invention was to devise a memory array that has simultaneous programming of one memory region and erasing of another memory region.

SUMMARY OF THE INVENTION

The above object has been met with semiconductor non-volatile memory array having cells in one row that can be written while cells in another row are erased. The cells feature a non-volatile memory translator of the type having a floating gate, plus a charge injector formed in an isolated but adjacent isolation area, plus customary row and column address lines. The charge injector creates space charge flowing toward the bottom of the substrate below isolation regions. Because of proximity of the injector to the memory translator, one or more of the electrodes of the memory transistor is biased to attract charge, e.g. holes. Impacts of the holes upon the charged electrode or electrodes gives rise to secondary particles, preferably electrons, by impact ionization, having sufficient energy for tunneling onto the floating gate. Current stimulation in the injector, a fast diode, and electrode bias in the transistor, in a carefully controlled manner leads to placement of precise amounts of charge on the floating gate. A current meter placed at an electrode may or could measure the transferred charge over a particular range, out of several possible ranges, determined by substrate and injector region doping. Different doping levels give rise to different conduction thresholds for memory cells in the transistor and hence different ranges. The different thresholds in a transistor array allow an array to act over an extended range of analog signal trimming, without analog-to-digital conversion.

To achieve simultaneous writing and erasing, a row being currently written is selected by a word line, while the same line erases an adjacent, non-current row. The word line is spaced by dielectric material from a plurality of polysilicon plates, the spacing creating a capacitive relation relative to the word line. The poly plates have tangs that form control gates of transistors. Tangs extending in one direction form EEPROM control gates for writing in one row while tangs extending in another direction form control gates for erasing in another row.

BRIEF DESCRIPTION OF THE DRAWINGS

FIG. 1 is a circuit diagram of a portion of a non-volatile transistor memory array in accordance with the present invention.

FIG. 2 is a redrawn schematic drawing of a memory cell shown in the memory array of FIG. 1.

FIG. 3 is a sectional view of a memory cell in the memory array of FIG. 1, taken along lines 3-3 of FIG. 4.

FIG. 4 is a tope view of a chip layout of a memory cell shown in FIG. 2.

FIG. 5 is a plot of injector current versus voltage in a band-to-band tunneling operating area contrasted with an avalanche breakdown area for a transistor memory cell of the kind shown in FIG. 2.

DETAILED DESCRIPTION OF THE INVENTION

Figure 6:
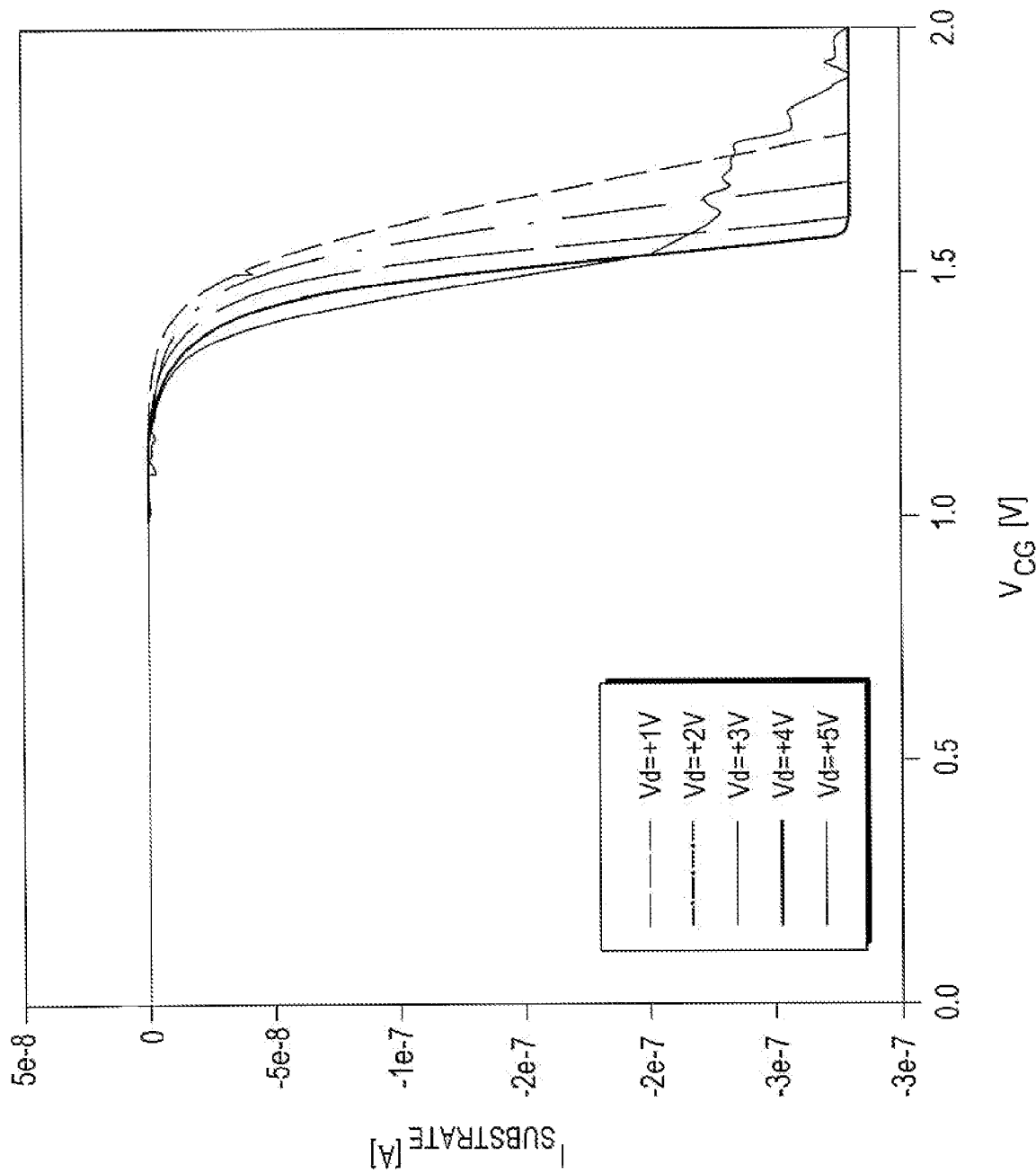
FIG. 6 is a plot of injector current as a function of drain and control gate voltage bias for a transistor memory cell of the kind shown in FIG. 2.

With reference to FIG. 1, a first memory cell 15 of a non-volatile transistor memory array has first and second programming lines 11 and 13, associated with respective contacts 22 and 26, as well as bit lines 17 and 37 and word line 19 all running through the cell and into neighboring cells. In particular, programming lines 11 and 13, bit line 17 and word line 19 run into neighboring cell 115 in a first direction, while bit line 37 runs into neighboring cell 215 in a second direction. Word line 19 is in a capacitive relation to a polysilicon plate, forming capacitive device 25. Word line 119 in FIG. 2 similarly relates to another polysilicon plate (130, shown in FIG. 2) forming capacitive device 125. Each memory cell has an EEPROM memory transistor 23 and a current injector including a fast diode 29, with a cathode connected to an electrical contact 22 and to an electrode of an MOS injector transistor 21. The injector transistor 21 has a single poly control gate (represented by 21A, 21B in FIG. 1), described below. Further in FIG. 1, MOS injector transistor 21 is biased by either actuation line 36 (21A), or by means of capacitive coupling via word line 19 (21B), or both, depending on the mode of operation. The anode of diode 29 is connected to the transistor substrate and electrical contact 24. Biasing of first program line 11 of transistor 21 provides reverse bias to diode 29. Such reverse bias generates current toward the depth of the substrate.

Program lines 11 and 13 are arranged to provide bias to MOS transistor 21 when appropriate bias is established on actuation line 33 by an n-channel MOS transistor 35 connected as a plate capacitor. EEPROM memory transistor 23 has a distributed floating gate formed by the gates of transistors 35, and 21, essentially lead wire forming line 36, while the control gate is a novel capacitively coupled structure partly formed by word line 19.

Word line 19 is shown to be part of a capacitive device 25 in cell 15, as well as capacitive device 125 in a neighboring cell. A feature of the word line and associated capacitive devices is that bias is provided to one cell for writing but in the neighboring cell for erasing in a manner but explained below with reference to FIGS. 3 and 4. The word line is one plate of the capacitive devices and may be either above or below the other plates. The other plates are polysilicon structures, one plate associated with two adjoining memory cells, having tangs or features that form part of an EEPROM akin to a control electrode, as explained more fully below.

A current meter 39 associated with bit line 37 and contact 32, measures current through memory transistor 23 via device 25 when transistor 23 is read or written to by placing appropriate bias on bit lines and programming lines. The programming lines 11 and 13 are normally floating during other times. The bit lines 17 and 37 are biased to provide an accurate current flow measurement through transistor 23 of a selected cell. Not shown in FIG. 1 are row and column address circuitry.

A column-wise adjacent cell 115 has the same components as cell 15, namely an MOS transistor 135 connected as a plate capacitor, a current injector formed by a diode 129 and injector transistor 121, an EEPROM memory transistor 123 and a capacitive device 125. A current meter 139 reads the output of memory transistor 123 along bit line 137. Programming lines 11 and 13 bias the current injector for conduction when appropriate bias is established by actuation line 133, with electrons driven to the floating gate of memory transistor 123. The method of charge injection into the oxide and floating gate or from the floating gate into the oxide and substrate can be any of the following mechanisms: photo-emission, Fowler-Nordheim tunneling, hot electron injection at appropriate temperatures (i.e. not lower than 500° C.), or Zener or Avalanche breakdown (i.e. if carriers in substrate acquire energies in excess of the electron or hole barrier height). Other cells in the memory array, such as cells 215 and 315 have similar components as memory cells 15 and 115, respectively.

The current to or from a selected memory transistor could be measured during a programming operation, i.e. channel conductivity present, in order to have an indication of the amount of stored charge on the floating gate structure formed by the three gates of transistors 35, 21, and 23. Part of the channel conductivity for MOS transistor 21 is provided by the injector, in particular, injector diode 29, as seen below. Impact ionization is most frequently measured by monitoring substrate current in the memory transistor. The source and drain of memory transistor 23 are electrically floating at bit line 17 and word line 19 during programming. Current meter 39 has contact via 32 for reading the state of charge.

To enable low voltage impact ionization, both sides of the injector diode junction 29 are heavily doped and the barrier thickness is approximately equal to the depletion width. As an example, this dimension is 100 Å with a doping level on the lightly doped side of the junction exceeding $10^{17}$ cm$^{-3}$.

In the memory cell 15 of FIG. 2, two programming lines 11 and 13 control operation of injector transistor 21 that can reverse bias diode 29. Recalling that this reverse bias of diode 29 generates impact ionization current that stores charge in the floating gate of memory transistor 23. But memory transistor 23 was said to have a device 25 in a capacitive relation with respect to word line 19. The device 25 has a polysilicon plate 30 having a first finger or tang 86' that serves as control gate of memory transistor 23 actuated by word line 19. The word line 19 may be over or under plate 30, separated by an insulative layer, such as oxide. In the case of being under plate 30, the word line 19 may be a buried word line in an n-well diffusion in order to save space. Another tang 186 extends out of memory cell 15 to an adjacent injector transistor as a control gate for the injector. Voltage on the word line 19 is capacitively coupled to plate 30 thereby providing voltage for erasing EEPROM memory transistor 23. Simultaneously, the plate provides a voltage to a control gate of an injector transistor in an adjacent cell. In other words, each injector transistor has a control gate that is a tang of a polysilicon plate, such as plate 30. In the case of injector transistor 21, tang 76' projecting from polysilicon plate 130 provides voltage via capacitive coupling with word line 139. Recall that voltage bias on line 33 charges line 36, stimulating impact ionization from diode 29 that passes through a common substrate toward memory transistor 23. Since line 36 serves as floating gate for the memory transistor, the floating gate remains charged, even after bias is removed from line 31. The role of tang 76' is to augment voltage applied to the control gate of transistor 21 and to allow word line control of programming. In the latter mode of operation, an entire row (or column) of memory cells could be programmed or erased under word line control. In the former mode of operation, some of the voltage for programming or erasing is coupled through a word line, but another part of the needed voltage is supplied by a voltage applied on line 33, thereby allowing programming and erase control of individual cells. The circuit topology of FIG. 2 is closer to an actual layout of a cell, compared to FIG. 1, because word lines are at right angles to bit lines.

With reference to FIG. 3, a p-type wafer substrate 61 is seen to have p-wells 63, 65, and 67 separated by insulative regions 73, 75, 77, an 79 formed by trench isolation. The p-wells have n+ doped implants 62 and 64 upon which are built the conductive vias 72 and 74. The implants 62 and 64 define source and drain electrodes for an MOS transistor 21 having a poly gate 76. The transistor 21 is connected to the fast diode 29 in FIGS. 1 and 2. Here the fast diode is seen to be formed by p-implanted region 81 abutting n+ region 62.

Together, transistor 21 and the fast diode form a current injector. As the reverse voltage across the diode is increased, the leakage current remains essentially constant until the breakdown voltage is reached where the current increases dramatically. This breakdown voltage is the Zener voltage. While for the conventional rectifier or diode it is imperative to operate below this voltage, the current injector diode is intended to operate at the Zener voltage.

The following is the correspondence between elements of FIGS. 1 and 2 and features shown in FIG. 3. Vias 72 and 74 of FIG. 3 terminate in contacts 22 and 26 of FIGS. 1 and 2. Diode 29 of FIGS. 1 and 2 is formed p-n junction 62 and 81 of FIG. 3. Subsurface N region 62 is connected by via 72 in FIG. 3 to program line 11 at contact 22 in FIGS. 1 and 2. Subsurface p region 64 is connected by via 74 in FIG. 3 to bit line 13 at contact 26 in FIGS. 1 and 2. Subsurface region 91 contacted by via 90 is the actuation line 33 for bias of the first memory cell 15 in FIG. 1. Control poly gate 76 is joined to control poly gate 86 by a line, represented by line 85 in FIG. 3 and the connected gates of transistors 21 and 23 in FIGS. 1 and 2. Control poly gate 76 is tang 76' of poly plate 130 in FIG. 2 that may be controlled by voltages applied to word line 119. The same gate is also controlled by voltage applied on line 33 of MOS device 35 for biasing of the gate to establish writing or programming in transistor 23. With word line control, a block of memory transistors may be programmed at the same time. With gate control from device 33, a single transistor in programmed.

In FIG. 3, the via 97 communicates with current meter 39, seen in FIGS. 1 and 2, through contact 32. Memory transistor 23 has a control poly gate 86 spaced between drain 82 and source 84, in turn communicating through vias 97 and 99 to the drain 82 and the source 84. Subsurface region 93 connected by via 94 for external contact is actuation line 133 for bias of the second memory cell 115 in FIG. 1. Recall that transistor 23 has a floating gate formed three gage leads for transistors 35, 21, and 22 seen in FIGS. 1 and 2. The gate leads are represented by dashed line 85 in FIG. 3. Control gate 86 is a tang 86N of poly plate 30 of device 25 seen in FIG. 2. Contact 32 is associated with current meter 39 on line 37. Each well may have a current meter although only the current meter 39 associated with measuring charge on a memory cell is discussed herein.

In FIG. 3, the transistor 223 is a memory transistor of an adjacent cell. The transistor 223 is symmetric with transistor 23 having a shared electrode 84 and drain electrode 88. Via 101 connects drain electrode 88 to a drain contact. The via 99 above shared electrode 84 forms a plane of symmetry except for current measuring electrodes and provides bias for associated transistors 23 and 223, similar to via 90 and subsurface region 91, but using actuation line 103 seen in FIG. 4. Control poly region 92 is a tang of another poly plate and so is poly region 176 of injection transistor 221. The floating gate for memory transistor 223 is actually formed by three gate leads, analogous to the leads of transistors 35, 21, and 23, indicated by dashed line 185. To the right of p-well 65 is p-well 67, separated by isolation region 77. The doped n-implants 162 and 164 are in p-well 67, below conductive vias 172 and 174. The implants 162 and 164 define electrodes for MOS injection transistor 221. A cooperating part of the current injector is formed by a diode having p-implanted region 181 abutting n+ region 162. The diode is made by implants at the same time and in the same manner as the diode associated with transistor 21. The diode is controlled by transistor 221, having control gate 176, operating in the same manner as transistor 21. Electrons for charge storage on floating gates 85 and 185 are generated by this impact ionization. These electrons are involved in transfer to the floating gates by tunneling hot electron injection or other known mechanisms.

The measured current on current meter 39 is proportional to stored charge on the floating gate of the memory transistors in the same well. Since more than one memory transistor can share the same well, calibration is needed to relate measured current to stored charge.

One of the remarkable features of the present invention is illustrated in FIG. 4. The word line 19 is seen to lie under or over poly plate 30. The poly plate 30 has a pair of tangs 86' and 186, extending in opposite directions. The tang 86' is the control gate 86 of memory transistor 23. See FIG. 3. The tang 186 is the control gate of an injector transistor in another row. Voltage on word line 19 induces voltage on poly plate 30, a capacitor-like device. Tang 86' causes erasing of memory cell 23 while tang 186 initiates impact ionization current in an injector transistor in another row and hence writing in another row. This is similar to action by poly plate 130, spaced over or under word line 119 by an insulative layer, such as oxide, and having tang 76 projecting into injector transistor 21 as its control gate. Voltage on word line 119 induces voltage on poly plate 130 and hence on tang 76. This voltage initiates impact ionization current that stores charge in the floating gate of memory transistor 23. Via 99, a common electrode for memory transistor 23 and 223 in FIG. 3, is an axis of symmetry for structures to the right, except for current measuring lines. Lateral symmetry allows two memory transistors to share the same well and achieve a good degree of compactness.

Each word line has a capacitive relation with a plurality of poly plates, all spaced apart from the word line by insulative material, such as oxide. A voltage applied to a word line can cause writing to all non-volatile memory transistors in one row and erasing to all non-volatile memory transistors in another row. Each poly plate preferably has two tangs extending in opposite directions, forming poly gates of transistors in adjacent rows.

In FIG. 5, the substrate current is plotted against voltage of the gate electrode of the MOS transistor associated with the injector. Note that above 1.0 volts, at region 200, there is an almost linear increase in current as voltage increases. To the left of the vertical line "L" is the band-to-band tunneling region. To the right of the vertical line L is the avalanche region. In the avalanche region, there is no longer a linear increase in current as voltage increases. The avalanche region should be avoided. The characteristic curve of FIG. 3 is for a particular level of injector doping. Different curves exist for different dopings.

In FIG. 6, different characteristic curves are shown relating slightly different substrate current, plotted along the vertical axis, for different control gate relative to drain bias voltages, plotted on the horizontal axis. Five storage levels are shown.

Figure 7:
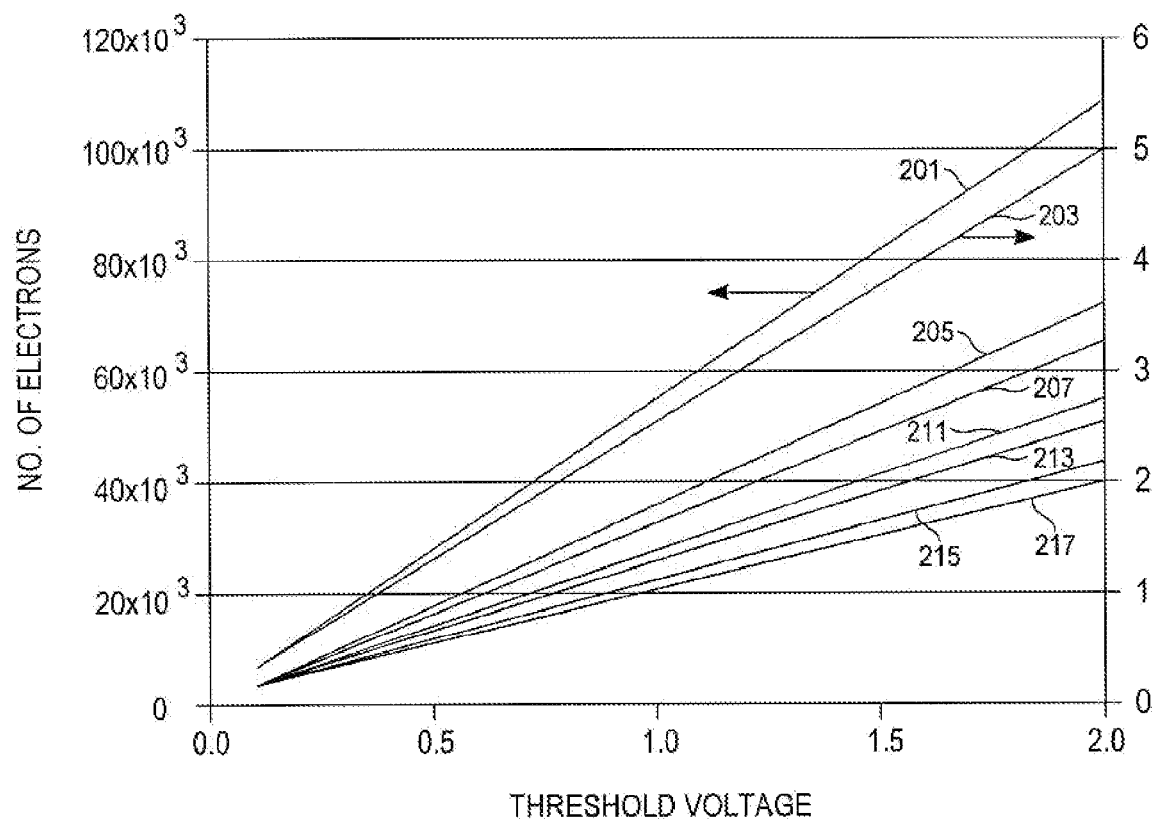
FIG. 7 is a plot of number of electrons stored as a function of threshold voltage for memory cells of the kind shown in FIG. 2.

In FIG. 7, it is seen that different threshold voltages, permit different ranges of stored electrons to be selected. The first pair of curves 201, 203 corresponds to stored electrons from first substrate current at a first threshold voltage. The second pair of curves 205, 207 corresponds to stored electrons from a second substrate current for a second threshold voltage. A similar situation exists for the third pair of curves 211, 213 and the fourth pair of curves 215, 217. So different threshold voltages for the storage transistors can select varying amounts of stored charge. Differing threshold voltages could be associated with different rows in a memory array.

Figure 8:
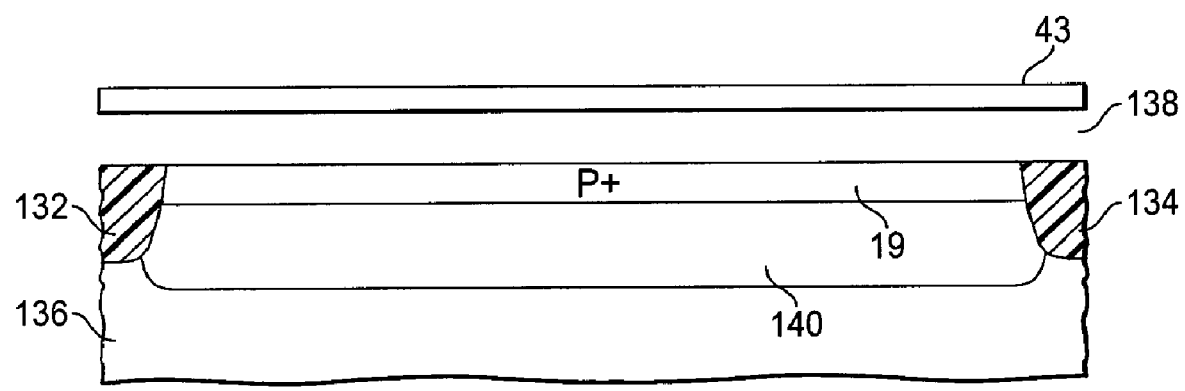
FIG. 8 is a sectional view of a word line in a memory cell in the memory array of FIG. 1, taken along lines 8-8 of FIG. 4.

In FIG. 8, word line 19 is shown an example of diffused p+ layer in n-well 140 between isolation regions 132 and 134. The n-well 140 is formed in the p-type substrate 136. By diffusing the word line in the substrate, the word line geometry is made more compact. A layer of oxide 138 is deposited to a thickness of at least 1500 Å before the poly plate 43 is deposited. Poly plate 43 has the usual thickness of a control gate, perhaps 3000 Å. The diffused word line 19 runs under a plurality of poly plates, for example, all of the poly plates in a row. Whether the poly plates are diffused under the word line or not, all of the poly plates associated with one type of control gate in a row of memory cells are aligned under or over the word line in parallel relation therewith.

Word line 19 behaves as one plate of a capacitor. The layer of oxide 138 acts a dielectric separator for a second capacitor plate, the poly plate 43. In a memory array, the buried word line and the plurality of poly plates form a new type of semiconductor device in a memory array.

Burying of the word line is optional. The word line could be plated over the poly plates. However, by burying the word line a much more compact memory array is formed. As usual, each word line is controlled independently. Typically, each word line controls a single row or column of a memory array for a write operation and a single row or column for an erase operation. Tangs extending from each poly plate form control gates for translators as explained above. Because the tangs extend from the poly plates in opposite directions it is possible to control writing in one row where the tangs operate or control injector transistors and to control erasing in another row where the tangs operate or control a memory transistor.

In operation, following are suggested voltages for word lines and bit lines for memory cell programming where the cell is an array having "M" rows, where "M" is greater than "i". $WL_i$ is the "i"th word line where "i" is an integer and $BL_i$ is the "i"th bit line. The n-well is at approximately positive 5 volts and the p-substrate is grounded. The values below are sub-bandgap ionization voltages.

| Program Cell | |
| --- | --- |
| $WL_i - 1$ = GND | $BL_i - 1$ = ~+3-5 v |
| $WL_i$ = ~+5 v | $BL_i$ = FLOAT |
| $WL_i + 1$ = GND | $BL_i + 1$ = FLOAT |

Following are suggested voltages for erasing, assume a Fowler-Nordheim erase mode. The n-well is at approximately negative 15 volts and the p-substrate is grounded.

| Erase Row | |
| --- | --- |
| $WL_i - 1$ = GND | $BL_i - 1$ = FLOAT |
| $WL_i$ = ~-15 v | $BL_i$ = FLOAT |
| $WL_i + 1$ = GND | $BL_i + 1$ = FLOAT |
| Erase Block | |
| $WL_i - 1$ = ~-15 v | BL - FLOAT (ALL) |
| $WL_i$ = ~-15 v | |
| $WL_i + 1$ = ~-15 v | |

Following are suggested read voltages. The n-well and the p-substrate are both grounded. The active bit line voltage must be lower than the programming voltage.

| Read Cell | |
| --- | --- |
| $WL_i - 1$ = GND | $BL_i - 1$ = FLOAT |
| $WL_i$ = ~+5 v | $BL_i$ = $+V_{DD}$ (~1.8 v)+ |
| $WL_i + 1$ | $BL_i + 1$ = FLOAT | the above voltage values are exemplary and intended to indicate relative values. Actual values will differ.

What is claimed is:

1. In a non-volatile transistor memory array, a semiconductor device comprising:
   a word line extending linearly through a plurality of memory cells, and
   a plurality of conductive plates in spaced apart, capacitive relation to the word line, each plate having a tang projecting from the plate and forming a gate for a transistor in a memory cell, wherein the plurality of polysilicon plates are aligned over the word line in parallel relation therewith.

2. The device of claim 1 wherein the word line is a buried diffusion in a semiconductor substrate.

3. The device of claim 2 wherein said buried diffusion is a p+ diffusion in a n-well.

4. The device of claim 1 wherein each poly plate has a tang forming a control gate of an injector transistor, associated with a memory transistor.

5. The device of claim 1 wherein each poly plate has a first tang forming a control gate of a memory transistor and a second tang forming a control gate of an injector transistor associated with the memory transistor.

6. The device of claim 5 wherein the first and second tangs of each poly plate extend in opposite directions.

7. In a non-volatile transistor memory array of the type having a plurality of memory cells formed in and upon a semiconductor substrate, including capacitive elements having at least one capacitor plate, the improvement comprising:
   a plurality of word lines, formed as a buried diffusion in the semiconductor substrate, with word lines positioned to be second capacitor plates to said capacitive elements of the memory cells, wherein said word lines are under the capacitor plate of said capacitive elements.

* * * * *